US012575236B2

(12) United States Patent (10) Patent No.: US 12,575,236 B2
Hong (45) Date of Patent: Mar. 10, 2026

(54) PIXEL MODULE AND DISPLAY APPARATUS HAVING THE SAME

(71) Applicant: SEOUL VIOSYS CO., LTD., Gyeonggi-do (KR)

(72) Inventor: Seung Sik Hong, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 631 days.

(21) Appl. No.: 17/994,052

(22) Filed: Nov. 25, 2022

(65) Prior Publication Data

US 2023/0178700 A1 Jun. 8, 2023

Related U.S. Application Data

(60) Provisional application No. 63/283,879, filed on Nov. 29, 2021.

(51) Int. Cl.
| | |
|---|---|
| *H10H 20/857* | (2025.01) |
| *H01L 25/075* | (2006.01) |
| *H10H 20/84* | (2025.01) |
| *H10H 29/14* | (2025.01) |

(52) U.S. Cl.
CPC ....... *H10H 20/857* (2025.01); *H01L 25/0753* (2013.01); *H10H 20/84* (2025.01); *H10H 29/142* (2025.01)

(58) Field of Classification Search
CPC . H01L 25/0753; H01L 25/0756; H10H 20/84; H10H 29/142; H10H 20/857; H10H 20/8513; G09G 2300/0426; G09G 2300/0439; G09G 2300/0443; G09G 3/32
See application file for complete search history.

(56) References Cited

U.S. PATENT DOCUMENTS

| | | | | |
|---|---|---|---|---|
| 10,705,370 | B2 * | 7/2020 | Hyun | .................. H01L 25/0753 |
| 10,896,897 | B2 * | 1/2021 | Shao | ..................... H10H 20/857 |
| 11,195,822 | B2 * | 12/2021 | Pyeon | ................. H01L 25/0753 |
| 11,355,686 | B2 * | 6/2022 | Hong | .................. H10H 20/855 |
| 12,356,783 | B2 * | 7/2025 | Kim | ...................... H10H 20/824 |
| 2017/0187976 | A1 * | 6/2017 | Cok | ......................... G09G 3/20 |
| 2020/0211450 | A1 * | 7/2020 | Deng | .................. H10H 20/857 |

(Continued)

FOREIGN PATENT DOCUMENTS

| | | |
|---|---|---|
| KR | 1020190006430 A | 1/2019 |
| KR | 1020200081237 A | 7/2020 |

(Continued)

OTHER PUBLICATIONS

English translation of International Search Report for PCT/KR2022/019027, Mar. 16, 2023, 3 pages.

(Continued)

*Primary Examiner* — Victor A Mandala
(74) *Attorney, Agent, or Firm* — LaBatt, LLC

(57) ABSTRACT

A pixel module and a display apparatus having the same are provided. A display apparatus according to an embodiment includes a panel substrate and a plurality of pixel modules disposed on the panel substrate, in which each of the pixel modules includes a linking substrate including at least one interconnection region and a non-interconnection region adjacent to the interconnection region and a plurality of unit pixels disposed on each of the interconnection regions of the linking substrate.

17 Claims, 17 Drawing Sheets

(56)        References Cited

U.S. PATENT DOCUMENTS

| | | | | |
|---|---|---|---|---|
| 2020/0312819 | A1* | 10/2020 | Shao | H01L 22/14 |
| 2020/0313056 | A1* | 10/2020 | Hong | H10H 20/853 |
| 2020/0403107 | A1* | 12/2020 | Chu | H10F 30/2215 |
| 2021/0065618 | A1 | 3/2021 | Cao et al. | |
| 2021/0202449 | A1 | 7/2021 | Shin et al. | |
| 2021/0375833 | A1* | 12/2021 | Lee | H10H 20/857 |
| 2023/0230536 | A1* | 7/2023 | Kim | G09G 3/3241 |
| | | | | 345/55 |
| 2024/0258362 | A1* | 8/2024 | Cha | H10D 89/611 |

FOREIGN PATENT DOCUMENTS

| | | |
|---|---|---|
| KR | 1020210083875 A | 7/2021 |
| KR | 1020210134309 A | 11/2021 |

OTHER PUBLICATIONS

Extended European Search Report for corresponding European Patent Application No. 22899134.5, Nov. 5, 2025, 7 pages.

* cited by examiner

1000a

1000b

1000c

1000e

P1

P2

PIXEL MODULE AND DISPLAY APPARATUS HAVING THE SAME

CROSS-REFERENCE TO RELATED APPLICATIONS AND PRIORITY

This application claims priority to and the benefit of U.S. Provisional Application No. 63/283,879, filed on Nov. 29, 2021, the disclosure of which is hereby incorporated by reference for all purposes as if fully set forth herein.

TECHNICAL FIELD

The present disclosure relates to a pixel module for an LED display that implements an image using light emitting diodes and a display apparatus having the same.

BACKGROUND ART

Light emitting diodes are inorganic light sources, which are used in various fields such as display apparatuses, automobile lamps, general lighting, and the like. The light emitting diodes have advantages such as longer lifespan, lower power consumption, and quicker response, than conventional light sources, and thus, they have been replacing the conventional light sources.

The conventional light emitting diodes have been generally used as backlight light sources in display apparatuses. However, LED displays that directly realize images using the light emitting diodes have been recently developed.

In general, the display apparatus displays various colors through mixture of blue, green, and red light. In order to realize various images, the display apparatus includes a plurality of pixels, each of the pixels includes sub-pixels of blue, green, and red light, a color of a certain pixel is determined based on colors of the sub-pixels, and images can be realized through a combination of such pixels.

An LED display apparatus implements an image using very small LEDs in micro units. To manufacture the LED display apparatus, numerous pixels need to be transferred to a display panel substrate. Accordingly, it takes a lot of time, and many defects such as poor bonding may occur in a process of mounting micro-sized LEDs. In addition, when a defect occurs in pixels mounted on the display panel substrate, it is difficult to repair it. As a result, all the pixels mounted together with the panel substrate are discarded, which may result in a large cost loss.

SUMMARY

Technical Problem

Exemplary embodiments of the present disclosure provide a technique for easier transfer of LEDs to a display panel substrate.

Exemplary embodiments of the present disclosure provide a novel technology capable of easily providing various types of pixel modules.

Exemplary embodiments of the present disclosure provide a pixel module for easily repairing defective LEDs during a manufacturing process and a display apparatus having the same.

Exemplary embodiments of the present disclosure provide a pixel module that is configured to reduce an interval between pixels and a display apparatus having the same.

Technical Solution

A display apparatus according to an embodiment includes a panel substrate and a plurality of pixel modules disposed on the panel substrate, in which each of the pixel modules includes a linking substrate including at least one interconnection region and a non-interconnection region adjacent to the interconnection region and a plurality of unit pixels disposed on each of the interconnection regions of the linking substrate.

The linking substrate may include top pads for mounting the unit pixels and bottom pads for being mounted on the panel substrate, and the number of the bottom pads may be smaller than the number of the top pads.

The top pads may have a multilayer structure.

At least one of the bottom pads may be a dummy pad.

A shortest distance W3 between a center of the unit pixel and an edge of the pixel module may be less than ½ of an average distance W1 between centers of unit pixels adjacent to one another on a same interconnection region.

The linking substrate may include a plurality of interconnection regions, and a center-to-center distance W2 of unit pixels disposed on adjacent interconnection regions, respectively, and adjacent to one another may be within a range of ±10% of the average distance W1 between the centers of unit pixels adjacent to one another on the same interconnection region.

The linking substrate may include a plurality of interconnection regions, and the plurality of interconnection regions may have a same interconnection pattern.

The display apparatus may include a first molding member covering a region between the linking substrates; and a second molding member covering a region between the unit pixels.

The display apparatus may include an adhesive layer disposed on the second molding member; and an anti-glare layer disposed on the adhesive layer.

In an embodiment, the first and second molding members may be black, and the adhesive layer may be transparent.

A pixel module for a display apparatus according to an embodiment includes a linking substrate including at least one interconnection region and a non-interconnection region adjacent to the interconnection region, and a plurality of unit pixels disposed on each of the interconnection regions of the linking substrate.

The linking substrate may include top pads for mounting the unit pixels and bottom pads for being mounted on the panel substrate, and the number of the bottom pads may be smaller than the number of the top pads.

At least one of the bottom pads may be a dummy pad.

Each of the unit pixels may include three LEDs, in which LED groups emitting light of a same color in the unit pixels disposed in a same row may be electrically connected to same bottom pads, respectively, and LEDs disposed in a same column may be electrically connected to a single same bottom pad.

The linking substrate may include a plurality of interconnection regions, and the plurality of interconnection regions may have a same interconnection pattern.

A center-to-center distance W2 of unit pixels disposed on adjacent interconnection regions, respectively, and adjacent to one another may be within a range of ±10% of an average distance W1 between centers of unit pixels adjacent to one another on a same interconnection region.

A shortest distance W3 between the center of the unit pixel and an edge of the pixel module may be less than ½ of the average distance W1 between the centers of unit pixels adjacent to one another on the same interconnection region.

The linking substrate may include a plurality of interconnection regions and non-interconnection regions adjacent to each of the interconnection regions, and each of the interconnection regions may include a plurality of top pads disposed on an upper surface thereof and a plurality of bottom pads disposed on a lower surface thereof.

In each of the interconnection regions, the number of bottom pads may be smaller than the number of top pads.

The top pads may have a multilayer structure.

DETAILED DESCRIPTION OF THE ILLUSTRATED EMBODIMENTS

Figure 1A:
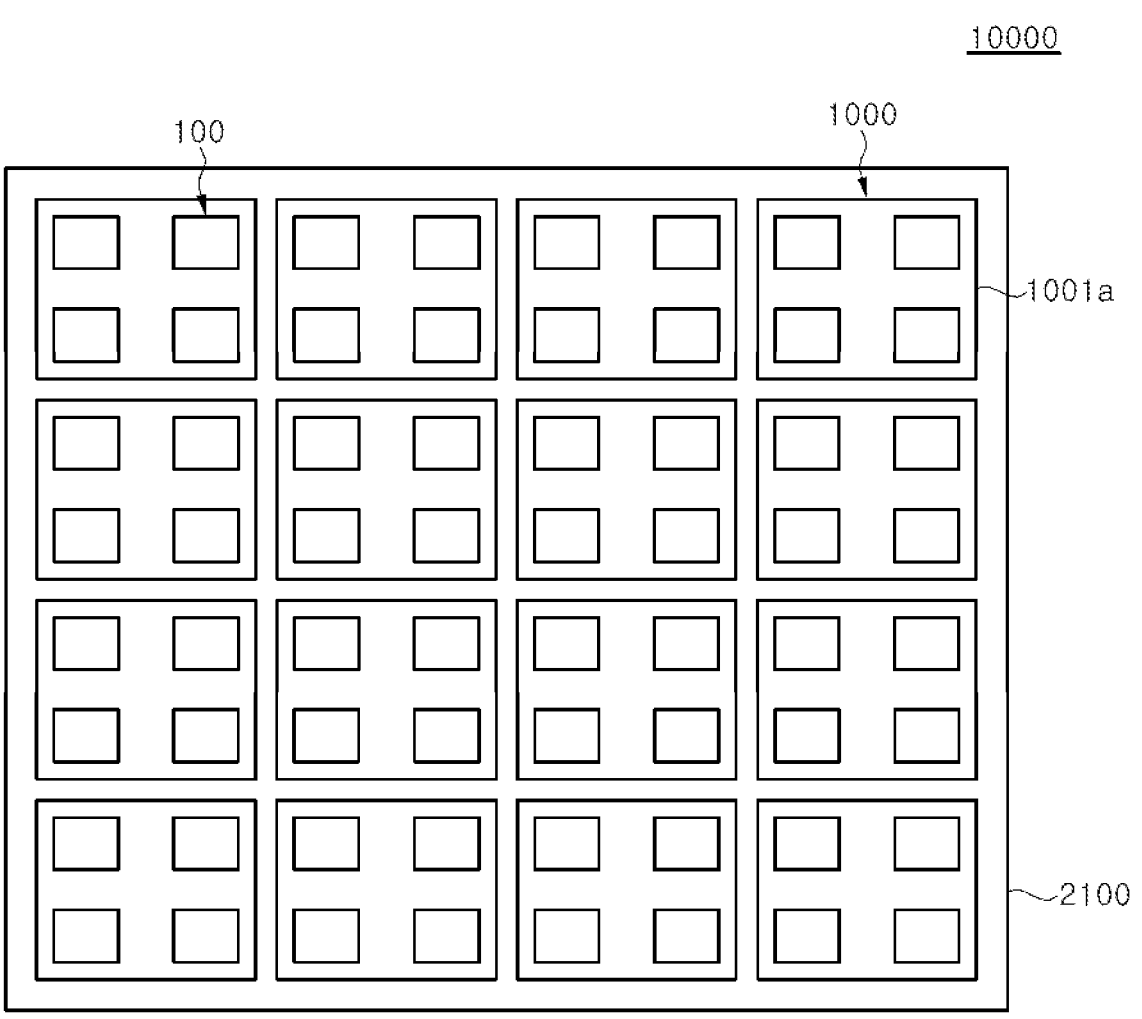
FIG. 1A is a schematic plan view illustrating a display apparatus according to an exemplary embodiment.

Hereinafter, exemplary embodiments of the present disclosure will be described in detail with reference to the accompanying drawings. The following exemplary embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 1B:
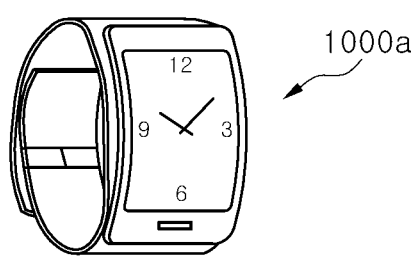
FIG. 1B is a schematic perspective view illustrating various display apparatuses according to an exemplary embodiment.
Figure 1B:
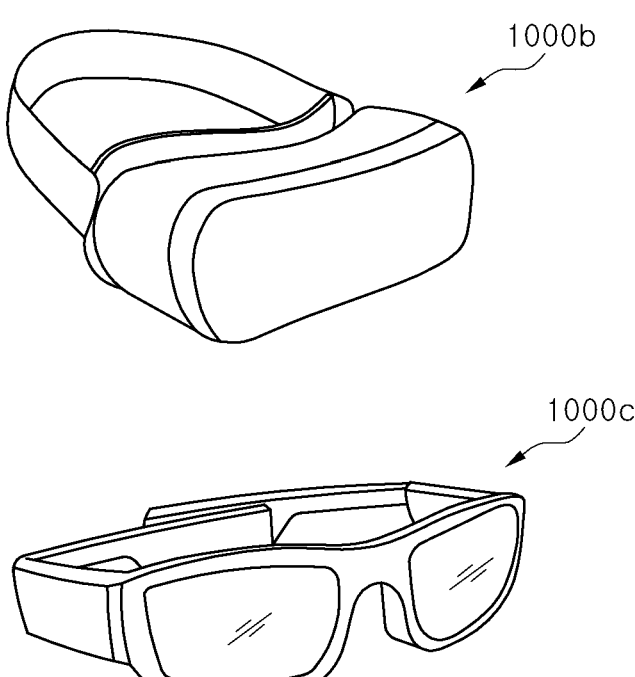
Figure 1C:
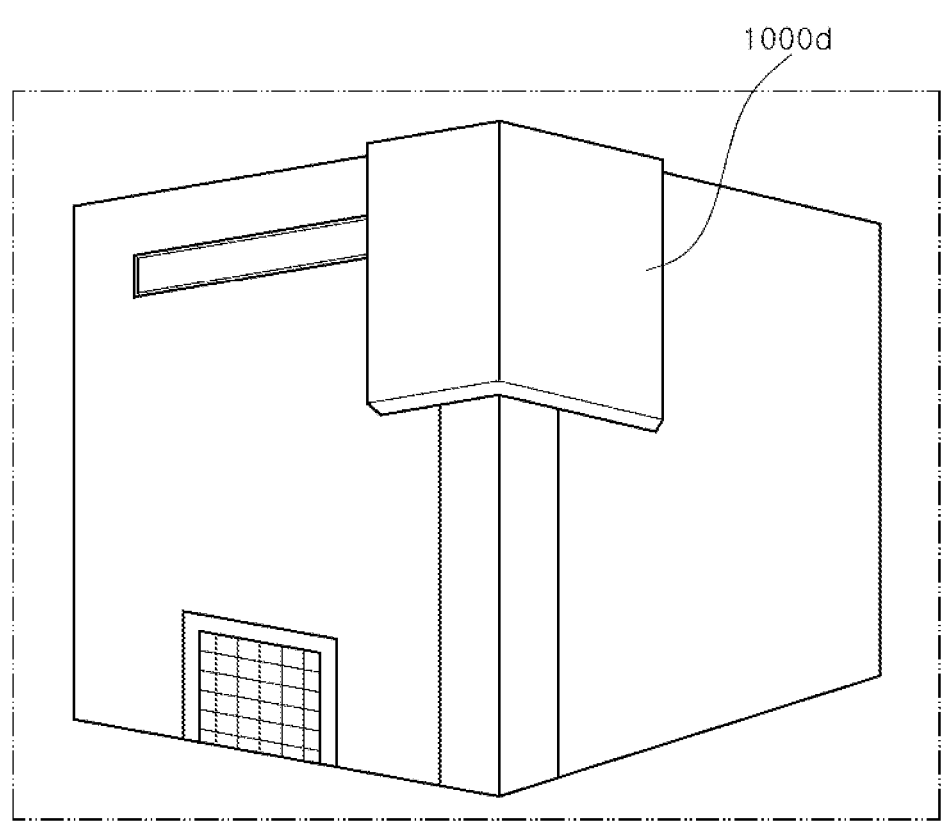
FIG. 1C is a schematic perspective view illustrating another display apparatus according to an exemplary embodiment.
Figure 1D:
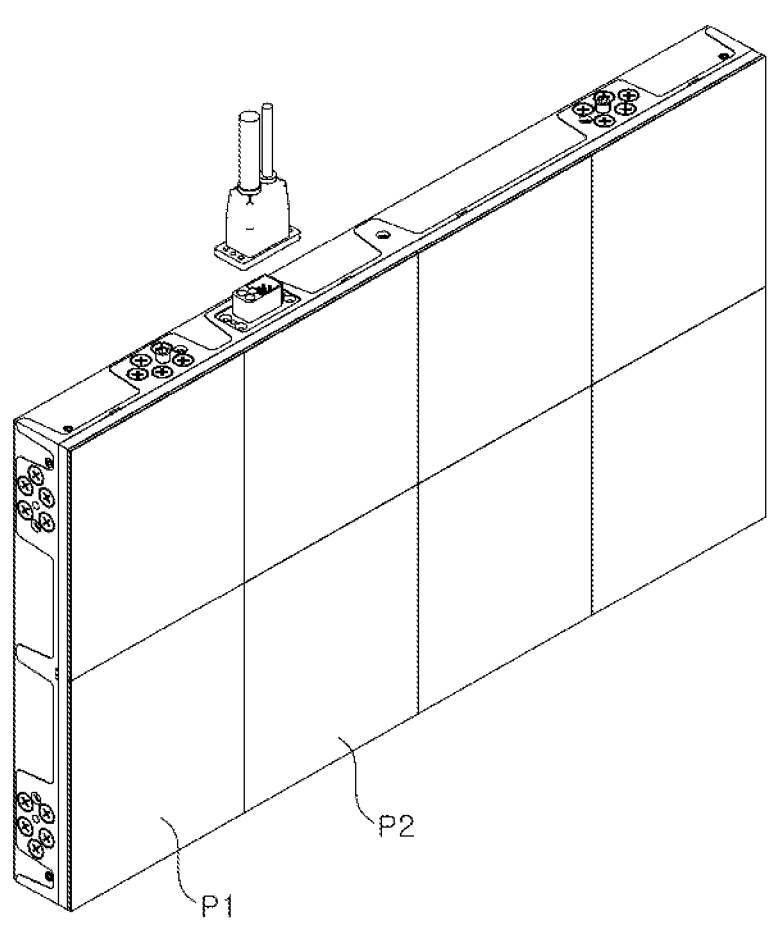
FIG. 1D is a schematic perspective view illustrating another display apparatus according to an exemplary embodiment.

FIG. 1A is a schematic plan view illustrating a display apparatus according to an exemplary embodiment. and FIGS. 1B, 1C, and 1D are schematic perspective views illustrating various display apparatuses 1000a, 1000b, 1000c, and 1000d according to an exemplary embodiment.

Referring to FIG. 1A, a display apparatus 10000 may include a panel substrate 2100 and a plurality of pixel modules 1000.

The display apparatus 10000 is not particularly limited, but may include a smart watch 1000a, a wearable display apparatus 1000b such as a VR headset or glasses, an AR display apparatus 1000c such as augmented reality glasses, or an indoor or outdoor display apparatus 1000d or 1000e such as a micro LED TV or signage. The panel substrate 2100 and the plurality of pixel modules 1000 may be disposed in the display apparatus.

The panel substrate 2100 may include a circuit for a passive matrix driving or active matrix driving manner. In an exemplary embodiment, the panel substrate 2100 may include wirings and resistors therein, and, in another exemplary embodiment, the panel substrate 2100 may include wirings, transistors, and capacitors. The panel substrate 2100 may also have pads that are capable of being electrically connected to the disposed circuit on an upper surface thereof.

In an exemplary embodiment, the plurality of pixel modules 1000 is arranged on the panel substrate 2100. Each of the pixel modules 1000 may include a linking substrate 1001a, and a plurality of unit pixels 100 disposed on the linking substrate 1001a, and may include a molding member covering the unit pixels 100.

A brightness of the smart watch 1000a may be 500 to 1500 cd/m² (or nits) or more, and a brightness thereof may be adjusted according to an external illumination. A brightness of the wearable display apparatus 1000b such as a VR headset or glasses may be 150 to 200 cd/m² (or nits), or a viewing angle thereof may be 50 degrees or more. The indoor or outdoor display apparatus 1000d or 1000e such as Micro LED TV or signage is preferably 1000 cd/m² (or nits) or more, or 80 degrees or more viewing angle, especially for outdoor use, 3000 cd/m² (or nits) or more. In the display apparatus 1000d or 1000e, a plurality of panels P1 and P2 is arranged in rows and columns and attached to a frame, and a plurality of micro LED pixels is disposed on the plurality of panels P1 and P2 to supply electricity or signals, and thus, the display apparatus may be turned on or its luminous intensity may be adjusted according to electricity supply or signals. The plurality of panels P1 and P2 may be connected to an external power source using respective connectors, or the plurality of panels P1 and P2 may be electrically connected to one another using connectors.

Hereinafter, various unit pixels 100 will be described in detail with reference to FIGS. 2A, 2B, 2C, and 2D.

Figure 2A:
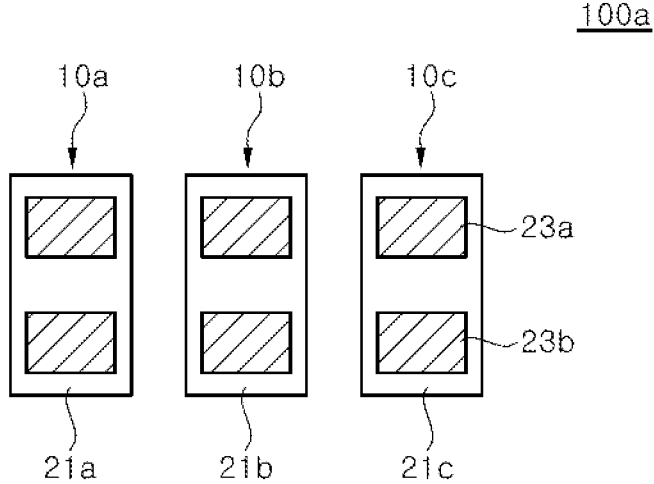
FIG. 2A is a schematic plan view illustrating a unit pixel according to an exemplary embodiment.
Figure 2B:
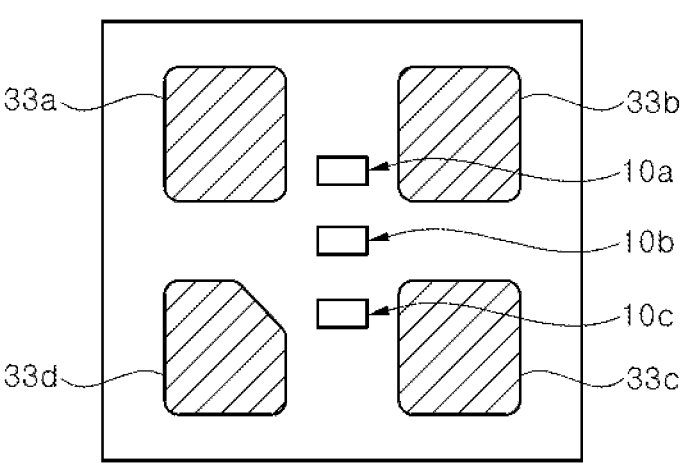
FIG. 2B is a schematic plan view illustrating a unit pixel according to another exemplary embodiment.
Figure 2C:
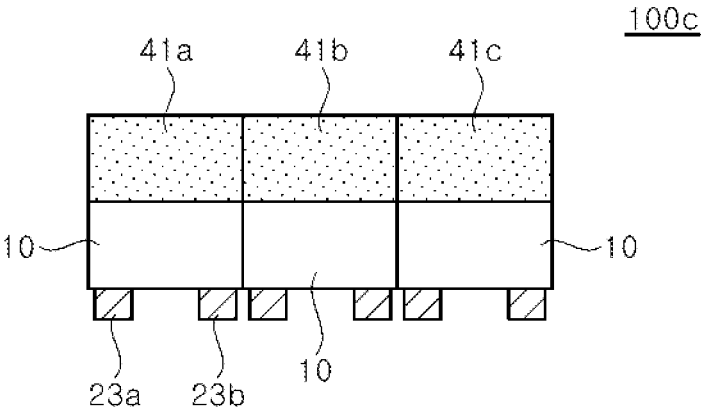
FIG. 2C is a schematic cross-sectional view illustrating a unit pixel according to another exemplary embodiment.
Figure 2D:
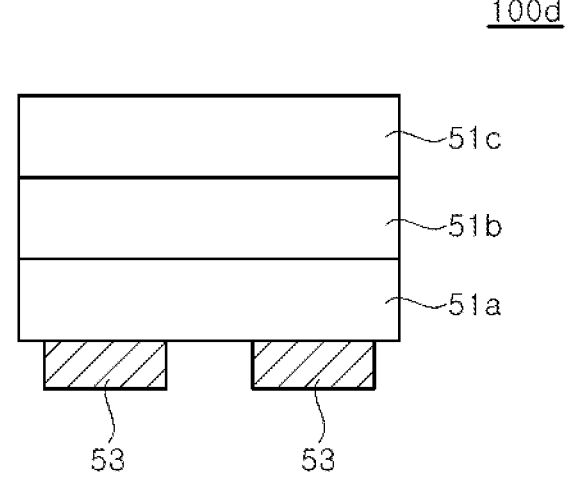
FIG. 2D is a schematic cross-sectional view illustrating a unit pixel according to another exemplary embodiment.

FIG. 2A is a schematic plan view illustrating a unit pixel 100a according to an exemplary embodiment, FIG. 2B is a schematic plan view illustrating a unit pixel 100b according to an exemplary embodiment, FIG. 2C is a schematic cross-sectional view illustrating a unit pixel 100c according to an exemplary embodiment, and FIG. 2D is a schematic cross-sectional view illustrating a unit pixel 100d according to an exemplary embodiment.

Referring to FIG. 2A, the unit pixel 100a includes a red light emitting diode chip 10a, a green light emitting diode chip 10b, and a blue light emitting diode chip 10c. Each of the light emitting diode chips may include light emitting structures 21a, 21b, and 21c and electrode pads 23a, and 23b disposed on the light emitting structure.

The light emitting structures 21a, 21b, and 21c of the light emitting diode chips 10a, 10b, and 10c include a first conductivity type semiconductor layer, an active layer, and a second conductivity type semiconductor layer, respectively. Although not shown in the drawings, the light emitting diode chips 10a, 10b, and 10c may further include an ohmic contact layer in ohmic contact with the second conductivity type semiconductor layer, first and second contact pads, and an insulation layer. The electrode pads 23a, and 23b may be electrically connected to the first and second conductivity type semiconductor layers by being connected to the first and second contact pads.

In an embodiment, in a case of the red light emitting diode chip 10a, the semiconductor layers may include aluminum gallium arsenide (AlGaAs), gallium arsenide phosphide (GaAsP), aluminum gallium indium phosphide (AlGaInP), or gallium phosphide (GaP).

In a case of the green light emitting diode chip 10b, the semiconductor layers may include indium gallium nitride (InGaN), gallium nitride (GaN), gallium phosphide (GaP), aluminum gallium indium phosphide (AlGaInP), or aluminum gallium phosphide (AlGaP).

In an embodiment, in a case of the blue light emitting diode chip 10c, the semiconductor layer may include gallium nitride (GaN), indium gallium nitride (InGaN), or zinc selenide (ZnSe).

The first conductivity type and the second conductivity type have opposite polarities, when the first conductivity type is an n-type, the second conductivity type is a p-type, and when the first conductivity type is a p-type, the second conductivity type become an n-type.

The first conductivity type semiconductor layer, the active layer, and the second conductivity type semiconductor layer may be grown on a growth substrate in a chamber using a known method such as metal organic chemical vapor deposition (MOCVD). The active layer of each of the light emitting diode chips may include a single quantum well structure or a multi-quantum well structure, and a composition ratio of semiconductors is adjusted so as to emit a desired wavelength.

The light emitting diode chips 10a, 10b, and 10c may be directly mounted on the linking substrate 1001a using the electrode pads 23a, and 23b.

Referring to FIG. 2B, the unit pixel 100b may be provided in a module type including the light emitting diode chips 10a, 10b, and 10c described above. The light emitting diode chips 10a, 10b, and 10c may be individually electrically connected to individual pads 33a, 33b, and 33c, and commonly electrically connected to a common pad 33d. For example, anodes of the light emitting diode chips 10a, 10b, and 10c may be electrically connected to the individual pads

33a, 33b, and 33c, and cathodes may be connected to the common pad 33d, or vice versa. The unit pixel 100b may be mounted on the linking substrate 1001a using the pads 33a, 33b, 33c, and 33d.

Referring to FIG. 2C, the unit pixel 100c may include light emitting diode chips 10 along with wavelength conversion material layers 41a, 41b, and 41c. Each of the light emitting diode chips 10 may have the electrode pads 23a and 23b, and may be mounted on the linking substrate using the electrode pads 23a and 23b.

The light emitting diode chips 10 may emit ultraviolet or blue light, and the wavelength conversion material layers 41a, 41b, and 41c may convert light emitted from the light emitting diode chips 10 into red, green, and blue, respectively. When the light emitting diode chip 10 emits blue light, the wavelength conversion material layer 41c may be omitted.

The wavelength conversion material layer 41c may include phosphors or quantum dots. For red, green, and blue phosphors, known phosphors may be used. The quantum dots may include group II-VI, group III-V, group IV-VI, group I-III-VI, and group II-IV-VI semiconductors as semiconductor materials, alloys or mixtures thereof. In particular, they may include CdSe, InAs, ZnSe, InP, GaP, CD, ZnS, HgTe, PbSe, and a ternary system such as $CuInS_2$, and may also include a doped material.

The quantum dots may be round or rod-shaped, the round-type quantum dots may have a size of about 2 nm to 20 nm, and the rod-shaped quantum dots may have a size of about 9×12 nm.

Referring to FIG. 2D, the unit pixel 100d has a structure in which a first semiconductor stack 51a, a second semiconductor stack 51b, and a third semiconductor stack 51c are vertically stacked. The first through third semiconductor stacks 51a, 51b, and 51c may be adhered to one another through an adhesive. Each of the first through third semiconductor stacks 51a, 51b, and 51c includes a first conductivity type semiconductor layer, an active layer, and a second conductivity type semiconductor layer.

In an embodiment, the first semiconductor stack 51a emits red light, the second semiconductor stack 51b emits green light, and the third semiconductor stack 51c emits blue light. In another embodiment, the second semiconductor stack 51b may emit blue light and the third semiconductor stack 51c may emit green light.

The unit pixel 100d also includes electrode pads 53. Although two electrode pads 53 are shown in the drawing, in this embodiment, at least four electrode pads 53 may be disposed. One electrode pad may be commonly electrically connected to the first through third semiconductor stacks 51a, 51c, and 51d, and three electrode pads 53 may be individually electrically connected to the first through third semiconductor stacks 51a, 51b, and 51c. For example, one electrode pad may be commonly electrically connected to cathodes of the first through third semiconductor stacks 51a, 51c, and 51d, and three electrode pads 53 may be individually electrically connected to anodes of the first through third semiconductor stacks 51a, 51b, and 51c, or vice versa.

Although various structures of the unit pixel 100 have been described above, the present disclosure is not limited thereto. The unit pixel 100 may be provided in various structures in addition to the structures described above, and any structure may be included in the present disclosure as long as it emits three primary colors of red, green, and blue.

The unit pixel 100 is disposed on the linking substrate 1001a and mounted on a panel substrate 2100. The linking substrate 1001a buffers a difference in line widths between fine interconnections connecting small-sized pixels and interconnections of the panel substrate 2100. Accordingly, an interval between pixels may be further reduced. Furthermore, since the pixels are disposed on the panel substrate 2100 by forming a pixel module 1000 and disposing the pixel module 1000 on the panel substrate 2100, the pixel module 1000 may be repaired or replaced after checking a defective pixel in each pixel module 1000. Since the pixel module instead of an entire display apparatus needs to be replaced or repaired, there is no need to repair or discard the entire display apparatus, thereby reducing costs due to defects.

Figure 3:
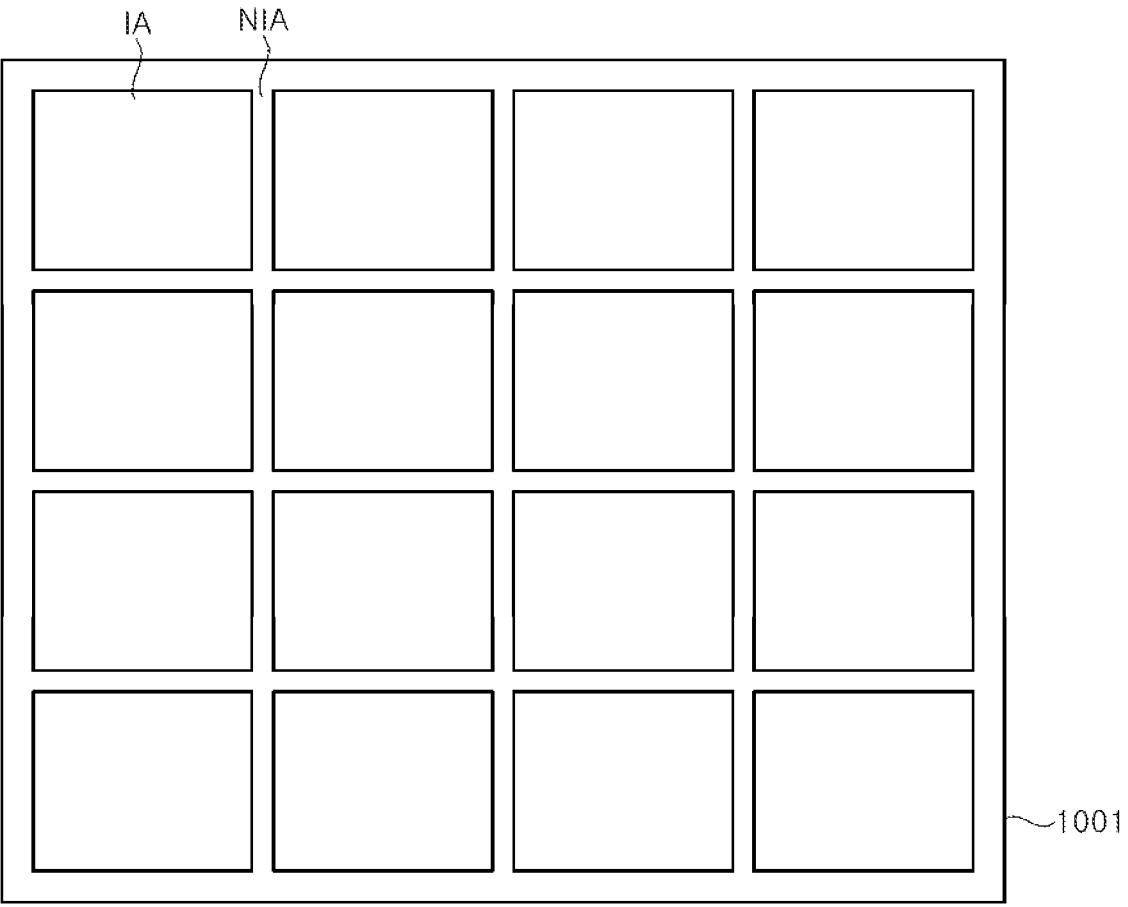
FIG. 3 is a schematic plan view illustrating a linking substrate according to an exemplary embodiment.

The linking substrate 1001a may be individually singularized, and a linking substrate 1001 before being singulation has a large area capable of manufacturing a plurality of pixel modules 1000. FIG. 3 is a schematic plan view illustrating the linking substrate 1001 according to an exemplary embodiment.

Referring to FIG. 3, the linking substrate 1001 includes a plurality of interconnection regions IA and a plurality of non-interconnection regions NIA. The non-interconnection region NIA may be disposed between the interconnection regions IA, and is adjacent to the interconnection region IA. The non-interconnection region NIA may surround each of the interconnection regions IA. Although the interconnection region IA is shown in a rectangular shape, it is not necessarily limited thereto. For example, the interconnection region IA may be defined as a region connecting outermost points of interconnections formed on the linking substrate 1001.

The interconnection regions IA may include a same interconnection pattern. The interconnection pattern formed in the interconnection region IA may be changed according to the number of pixels mounted on the interconnection region IA. In addition, top pads (not shown) for mounting the unit pixel 100 are disposed in the interconnection region IA, and bottom pads for mounting the linking substrate 1001a on the panel substrate 2100 are disposed a bottom surface of the linking substrate 1001. The number of bottom pads is smaller than the number of top pads. This will be explained in detail later again.

Figure 4:
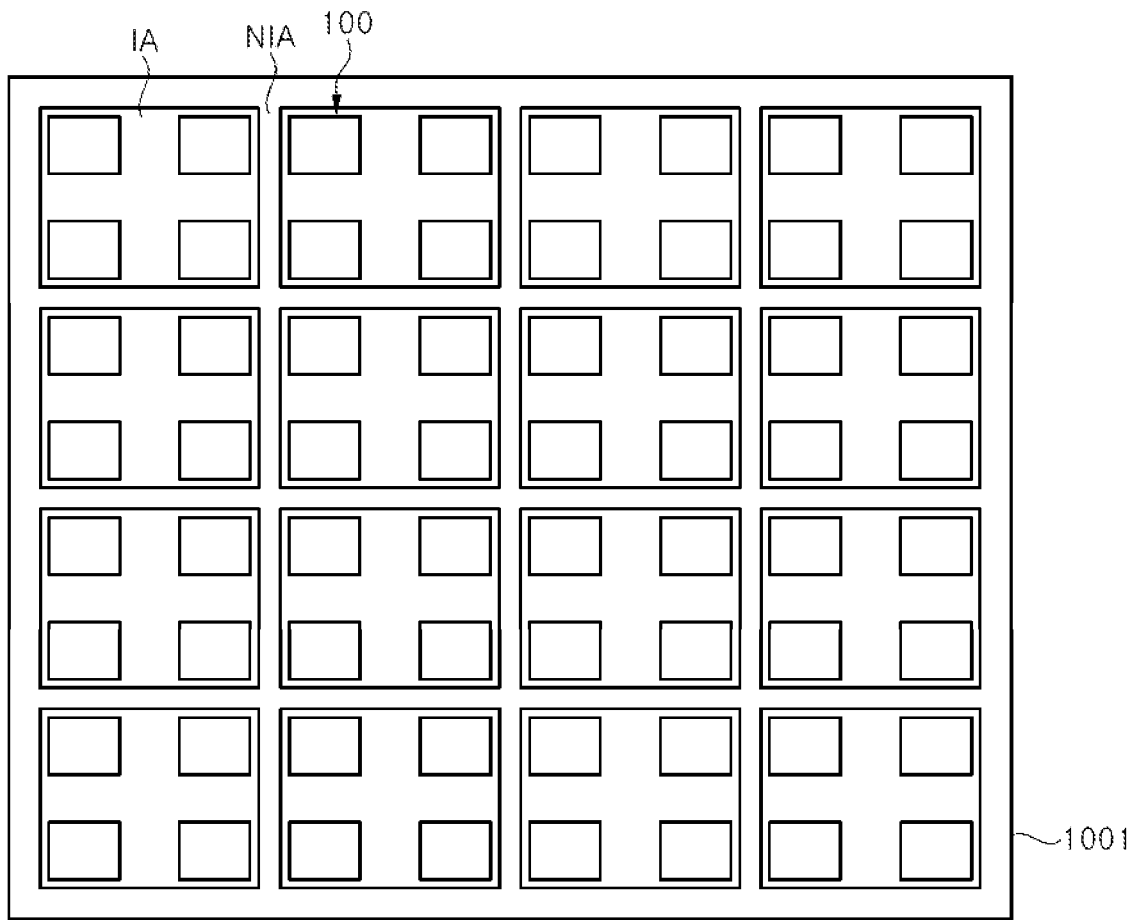
FIG. 4 is a schematic plan view illustrating pixels mounted on a linking substrate according to an exemplary embodiment.

FIG. 4 is a schematic plan view illustrating pixels 100 mounted on the linking substrate 1001 according to an exemplary embodiment.

Referring to FIG. 4, a plurality of unit pixels 100 is mounted on each of the interconnection regions IA. The unit pixels 100 may be disposed in the interconnection region IA, but the present disclosure is not necessarily limited thereto. Although FIG. 4 shows that four unit pixels 100 are mounted on each of the interconnection regions IA, this is just one example, and a larger number of unit pixels 100 may be mounted on each of the interconnection regions IA. The interconnection region IA has an interconnection pattern for driving the unit pixels 100 according to the number of unit pixels 100 mounted thereon. In particular, the interconnection region IA may have the interconnection pattern for driving the unit pixels 100 mounted thereon in a passive matrix form.

In an embodiment, when the unit pixel 100 has four electrode pads, and four unit pixels 100 are mounted on each of the interconnection regions IA, each of the interconnection regions IA includes at least 16 top pads, and has at least 8 bottom pads. To drive the unit pixels 100 arranged in an n×m matrix, at least 4×n×m top pads and at least (3×n+m) bottom pads may be disposed.

In another embodiment, as described with reference to FIGS. 2A and 2C, when the unit pixel 100 has six electrode pads 23a and 23b and four unit pixels 100 are mounted on each of the interconnection regions IA, each of the interconnection regions IA has at least 24 top pads and at least 8 bottom pads. At least 6×n×m top pads and at least (3×n+m) bottom pads may be disposed so as to drive the unit pixels 100 arranged in the n×m matrix.

As the number of unit pixels 100 disposed in each of the interconnection regions IA increases, the interconnection of the panel substrate 2100 may be further simplified, and thus, heat generation of the panel substrate 2100 may be reduced.

The linking substrate 1001 may be cut into various sizes, and thus, pixel modules 1000 having various structures may be provided. FIGS. 5A through 5D are schematic plan views illustrating pixel modules according to various exemplary embodiments.

Figure 5A:
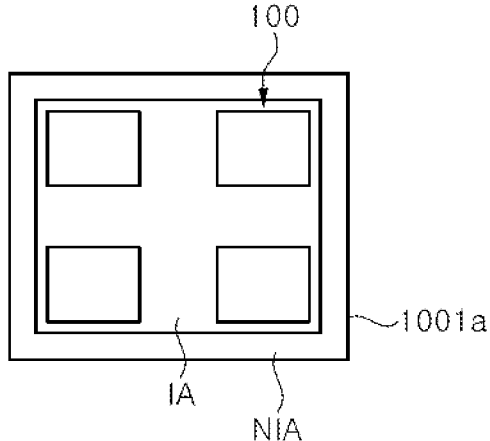
FIG. 5A is a schematic plan view illustrating a pixel module according to an exemplary embodiment.

Referring to FIG. 5A, the linking substrate 1001 may be cut so as to include only one interconnection region IA. A cutting line may be disposed in the non-interconnection region NIA. Accordingly, the pixel module 1000 includes the linking substrate 1001a having one interconnection region IA. The linking substrate 1001a may have a larger area than that of the interconnection region IA. The unit pixels 100 are arranged in the interconnection region, but the present disclosure is not limited thereto. The pixel module 1000 includes the number of unit pixels 100 mounted on one interconnection region IA. That is, as shown in FIG. 5A, the pixel module 1000 includes four unit pixels. Alternatively, when six unit pixels 100 are mounted on one interconnection region IA, the pixel module 1000 will include six unit pixels.

Figure 5B:
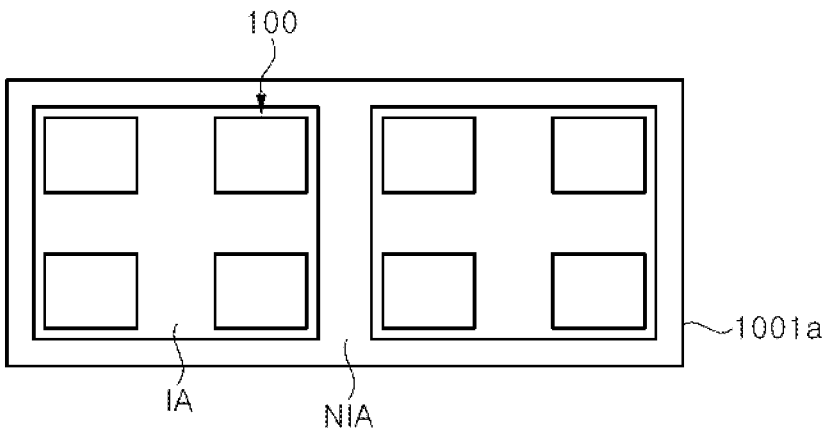
FIG. 5B is a schematic plan view illustrating a pixel module according to another exemplary embodiment.

Referring to FIG. 5B, the linking substrate 1001 may be cut so as to include two interconnection regions IA. Accordingly, the pixel module 1000 includes the linking substrate 1001a including two interconnection regions IA. In addition, the pixel module 1000 includes twice as many unit pixels 100 as that of the unit pixels 100 disposed in one interconnection region IA. As shown in FIG. 5B, when four unit pixels 100 are disposed in one interconnection region IA, the pixel module 1000 according to this embodiment includes eight unit pixels 100. In addition, when six unit pixels 100 are mounted on one interconnection region IA, the pixel module 1000 will include 12 unit pixels 100.

Figure 5C:
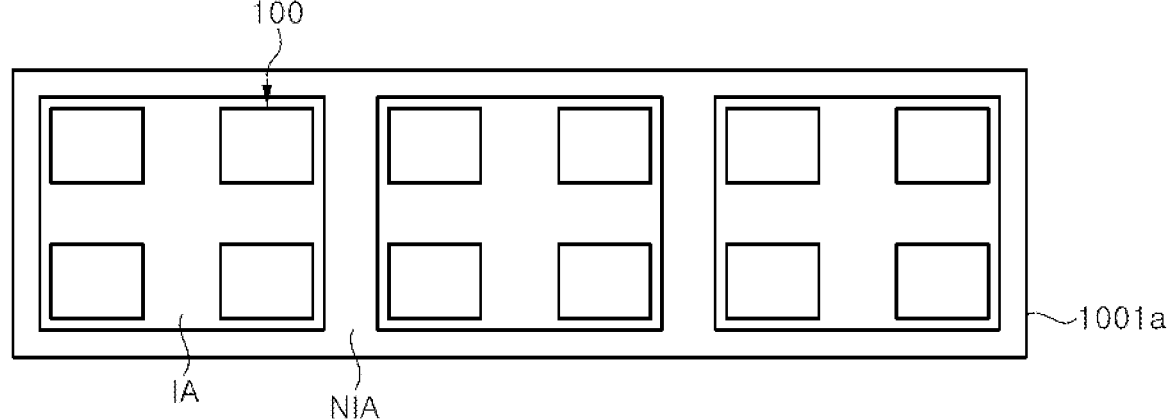
FIG. 5C is a schematic plan view illustrating a pixel module according to another exemplary embodiment.

Referring to FIG. 5C, the linking substrate 1001 may be cut so as to include three interconnection regions IA. Accordingly, the pixel module 1000 includes the linking substrate 1001a including three interconnection regions IA. In addition, the pixel module 1000 includes three times as many unit pixels 100 as that of the unit pixels 100 disposed in one interconnection region IA. As shown in FIG. 5C, when four unit pixels 100 are disposed in one interconnection region IA, the pixel module 1000 according to this embodiment includes 12 unit pixels 100. In addition, when six unit pixels 100 are mounted on one interconnection region IA, the pixel module 1000 will include 18 unit pixels 100.

The linking substrate 1001 may be cut so as to include one or more interconnection regions IA disposed in one row, but the present disclosure is not limited thereto. The linking substrate 1001 may be cut so as to include interconnection regions IA disposed in two or more rows.

Figure 5D:
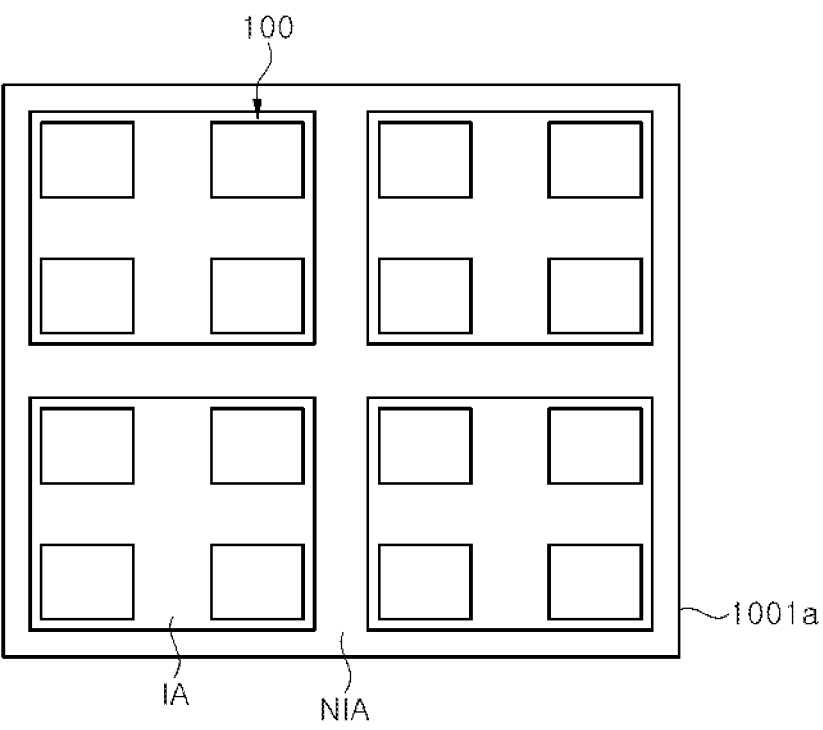
FIG. 5D is a schematic plan view illustrating a pixel module according to another exemplary embodiment.

Referring to FIG. 5D, the linking substrate 1001 may be cut so as to include four interconnection regions IA disposed in two rows. Accordingly, the pixel module 1000 includes the linking substrate 1001a including four interconnection regions IA. In addition, the pixel module 1000 includes four times as many unit pixels 100 as that of the unit pixels 100 disposed in one interconnection region IA. As shown in FIG. 5D, when four unit pixels 100 are disposed in one interconnection region IA, the pixel module 1000 according to this embodiment includes 16 unit pixels 100. In addition, when six unit pixels 100 are mounted on one interconnection region IA, the pixel module 1000 will include 24 unit pixels 100.

Figure 6:
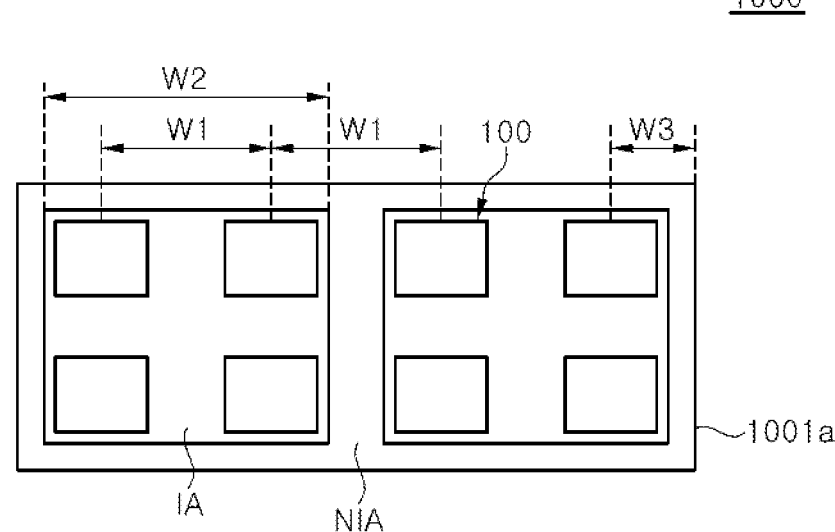
FIG. 6 is a schematic plan view illustrating a pixel module according to an exemplary embodiment.

FIG. 6 is a schematic plan view illustrating the pixel module 1000 according to an exemplary embodiment.

Referring to FIG. 6, the unit pixels 100 disposed on one interconnection region IA may be disposed at substantially equal intervals from one another. For example, a center-to-center distance W1 of unit pixels 100 disposed in one interconnection region IA may be defined as an average of center-to-center distances of adjacent unit pixels 100 in one interconnection region IA. The center-to-center distance of the unit pixels 100 may be within a range of W1±10%. The W1 may be within a range of 350 um to 660 um, for example.

In addition, a center-to-center distance W2 of the unit pixels 100 disposed on the interconnection regions IA adjacent to one another, respectively, and adjacent to one another may be within a range of W1±10%. Meanwhile, a shortest distance W3 from the center of the unit pixel 100 to an edge of the linking substrate 1001a may be less than ½ of the W1. However, the W3 may be larger than ½ of a width of the unit pixel 100.

When the W3 is ½ of the W1, the pixel modules 1000 mounted on the panel substrate 2100 may be in close contact with one another. When the W3 is smaller than ½ of the W1, the pixel modules 1000 mounted on the panel substrate 2100 may be spaced apart from one another.

Figure 7A:
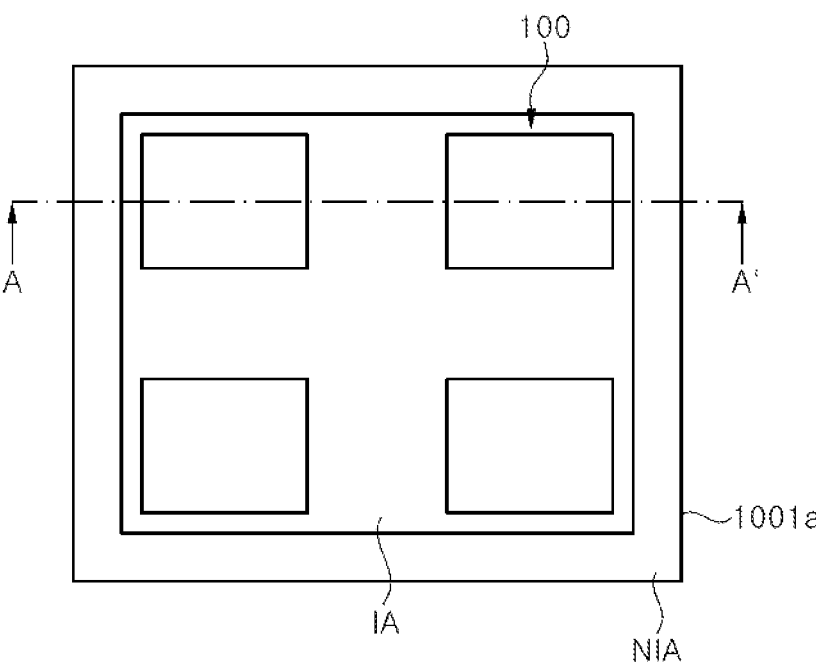
FIG. 7A is a schematic plan view illustrating a pixel module according to an exemplary embodiment.
Figure 7B:
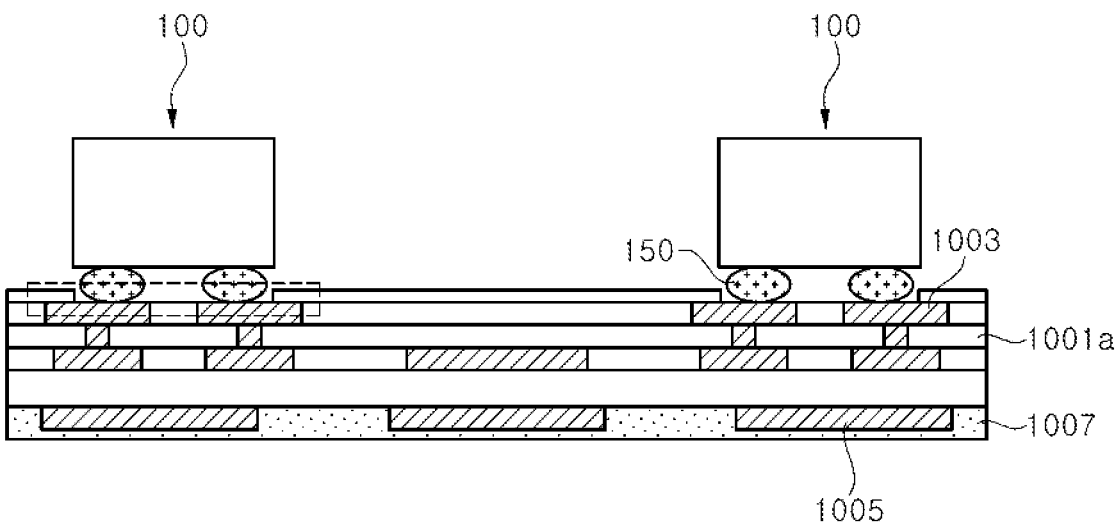
FIG. 7B is a schematic cross-sectional view taken along line A-A' in FIG. 7A.
Figure 7C:
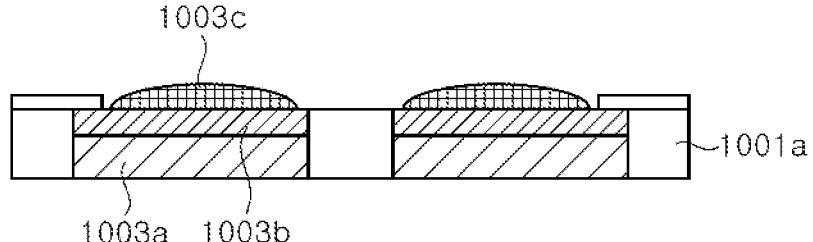
FIG. 7C is a schematic cross-sectional view showing an enlarged portion of FIG. 7B.
Figure 7D:
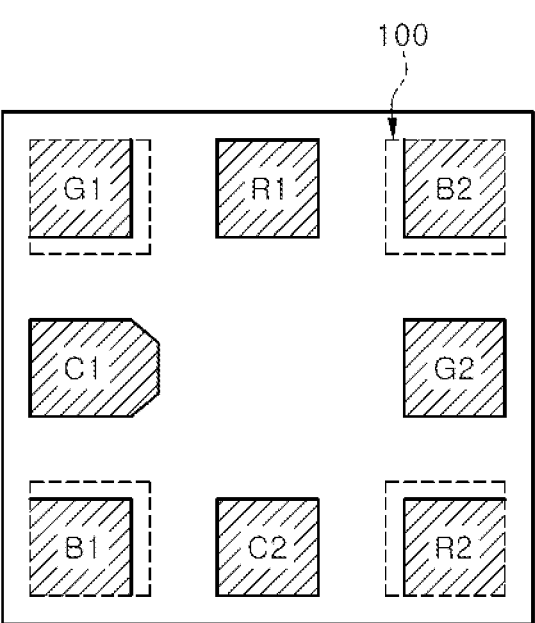
FIG. 7D is a schematic rear view illustrating a pixel module according to an exemplary embodiment.
Figure 7E:
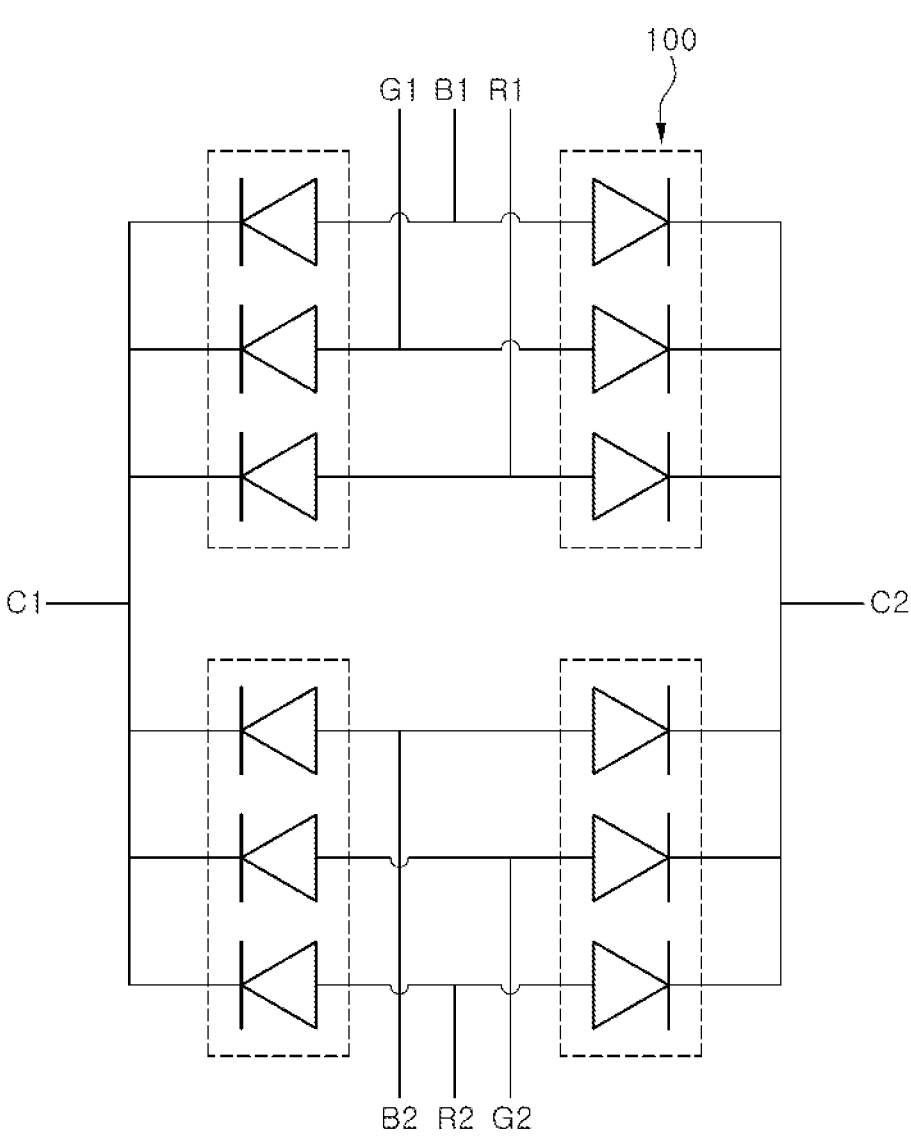
FIG. 7E is a schematic circuit diagram illustrating a pixel module according to an exemplary embodiment.

FIG. 7A is a schematic plan view illustrating a pixel module according to an exemplary embodiment, FIG. 7B is a schematic cross-sectional view taken along line A-A' in FIG. 7A, FIG. 7C is a schematic cross-sectional view showing an enlarged portion of FIG. 7B, FIG. 7D is a schematic rear view illustrating the pixel module according to an exemplary embodiment, and FIG. 7E is a schematic circuit diagram illustrating the pixel module according to an exemplary embodiment. For convenience of description, a pixel module 1000 including only one interconnection region IA will be described as an example.

Referring to FIGS. 7A, 7B, and 7C, a linking substrate 1001a may have a multi-layered interconnection structure, and includes top pads 1003 and bottom pads 1005. The top pads 1003 are pads for mounting unit pixels 100, and have a number corresponding to all electrode pads of the unit pixels 100. The unit pixels 100 may be bonded to the top pads 1003 using a bonding material 150. Meanwhile, the bottom pads 1005 are pads for mounting the pixel module 1000 on a panel substrate 2100, and have a smaller number than the number of top pads 1003. The bottom pads 1005 may be bonded to pads of the panel substrate 2100 using, for example, an anisotropic conductive adhesive (ACF, 1007). The number of bottom pads 1005 may be set to drive the unit pixels 100 as a passive matrix. Furthermore, a dummy pad not electrically connected to the unit pixels 100 may be added to the bottom pad 1005 or the top pad 1003.

The linking substrate 1001a has the multi-layered interconnection structure, and interconnections in each layer may also have the multi-layered structure. For example, as shown in FIG. 7C, the top pad 1003 may include a plurality of layers, for example, a first layer 1003a, a second layer 1003b, and a third layer 1003c. The first layer 1003a is a metallic layer formed using, for example, a printing technique, and may include a metallic material having high conductivity, for example, Cu. The second layer 1003b is a surface layer formed so as to prevent oxidation of the first layer, which may be formed on the first layer with a variety of materials using a method of, such as HASL, Lead-free HASL, ENIG, Immersion Ag, Immersion Sn, OSP, AgCl, soft gold, hard gold, ENEPIG, carbon ink, or the like. A material of the second layer 1003b may be Sn/Ag/Cu (SAC), Sn/Cu/Co, Sn/Cu/Ni/Ge, Au, Ni, Cu, Sn, Ti, Ag, Al, or a combination thereof. The third layer 1003c is a layer for enhancing a bonding force of the unit pixel 100 bonded to the top pad 1003, and may be, for example, AgSn or AuSn. The unit pixel 100 may be bonded using various bonding materials 150, and examples of the bonding material 150 may include Sn, ACF, AuSn, InSn, and the like.

Referring to FIGS. 7D and 7E, bottom pads 1005; R1, G1, B1, R2, G2, B2, C1, C2 are exposed to a lower surface of the linking substrate 1001a. When four unit pixels 100 are disposed on one interconnection region IA, at least eight bottom pads 1005 are disposed. When the unit pixels 100 are arranged in an n×m matrix, at least 3n+m bottom pads 1005 are disposed. A minimum number of bottom pads 1005 may be determined by the number of rows and columns of the unit pixel 100, and is independent of the number of electrode pads of one unit pixel 100. For example, LED groups disposed in a same row and emitting light of a same color are commonly connected to same bottom pads, respectively. As shown in FIG. 7E, among six LEDs arranged in a first row, LED groups emitting light of the same color are electrically connected to the bottom pads R1, G1, and B1, respectively. Among six LEDs arranged in a second row, LED groups emitting light of the same color are electrically connected to the bottom pads R2, G2, and B2, respectively.

Meanwhile, LED groups arranged in a same column are commonly electrically connected to the bottom pads C1 and C2, respectively. Six LEDs disposed in a first column are commonly electrically connected to the bottom pad C1, and six LEDs disposed in a second column are commonly electrically connected to the bottom pad C2.

Figure 8A:
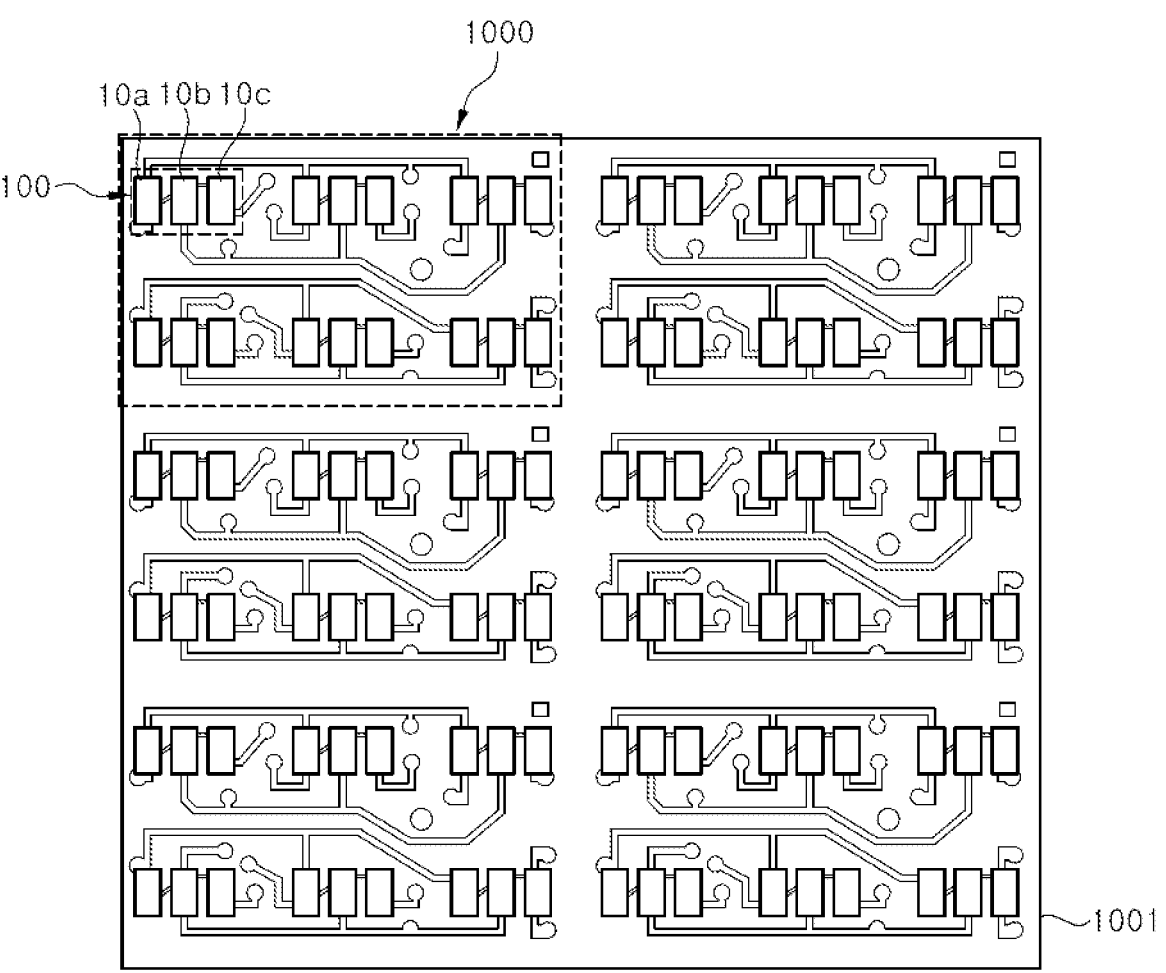
FIG. 8A is a schematic plan view illustrating a pixel module according to an exemplary embodiment.
Figure 8B:
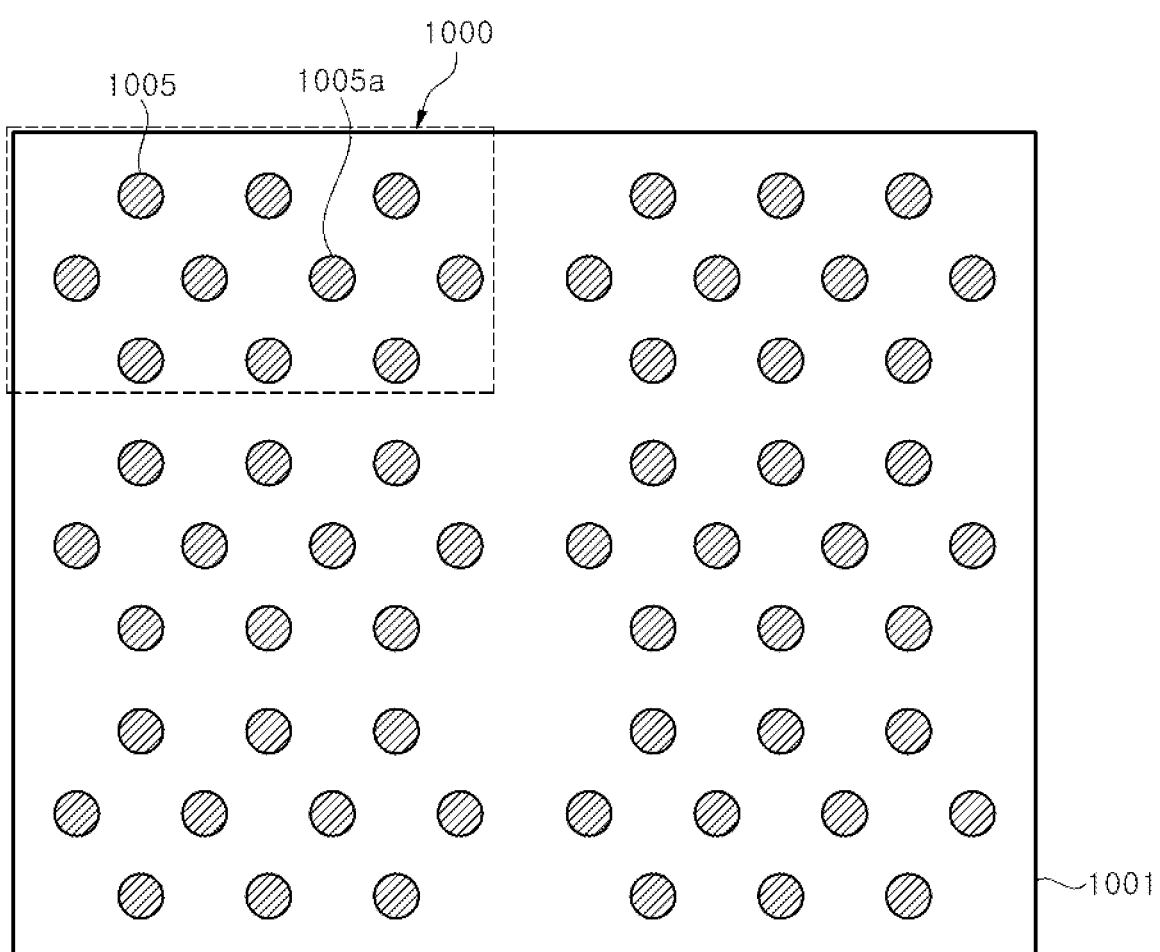
FIG. 8B is a schematic rear view illustrating a pixel module according to an exemplary embodiment.
Figure 8C:
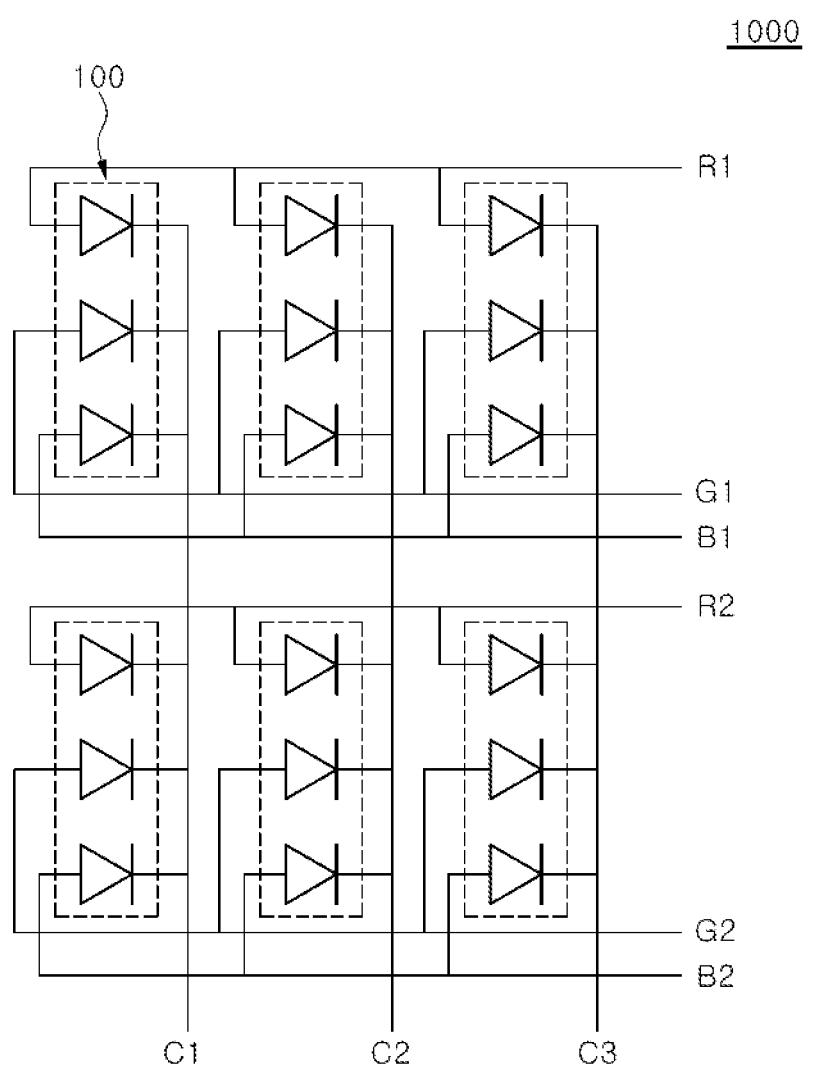
FIG. 8C is a schematic circuit diagram illustrating a pixel module according to an exemplary embodiment.

FIG. 8A is a schematic plan view illustrating a pixel module according to an exemplary embodiment, FIG. 8B is a schematic rear view illustrating the pixel module according to an exemplary embodiment, and FIG. 8C is a schematic circuit diagram illustrating the pixel module according to an exemplary embodiment. In this embodiment, a unit pixel 100 corresponds to the unit pixel 100a described with reference to FIG. 2A.

Referring to FIG. 8A, light emitting diode chips 10a, 10b, and 10c are directly mounted on a linking substrate 1001. The light emitting diode chips 10a, 10b, and 10c constitute one unit pixel 100. A pixel module 1000 may be provided by cutting the linking substrate 1001 in a region indicated by the dotted line. Alternatively, the linking substrate 1001 may be cut so as to include more interconnection regions.

Six unit pixels 100 are disposed in each interconnection region. Since three light emitting diode chips 10a, 10b, and 10c are disposed in each unit pixel, a total of 18 light emitting diode chips 10a, 10b, and 10c are disposed in one interconnection region. Accordingly, 36 top pads are disposed in the interconnection region.

Referring to FIG. 8B, since the unit pixels 100 are arranged in a 2×3 matrix on one interconnection region, at least nine bottom pads 1005 are disposed in each interconnection region. A bottom pad 1005a is added to at least nine bottom pads 1005, and may be electrically connected to any one of bottom pad 1005, or may be a dummy pad not electrically connected to the unit pixels 100. By disposing the bottom pad 1005a, the bottom pads 1005 and 1005a may be arranged in a symmetrical structure, and thus, deformation of the linking substrate 1001 may be prevented. Furthermore, heat dissipation effect may be improved by disposing the dummy pad.

Referring to FIG. 8C, a circuit in which nine bottom pads R1, G1, B1, R2, G2, B2, C1, C2, and C3 are connected to the light emitting diodes in the unit pixels 100 can be seen. Light emitting diodes disposed in a same row and emitting light of a same color are commonly electrically connected to a same bottom pad R1, G1, B1, R2, G2, or B2, and light emitting diodes disposed in a same column are commonly electrically connected to a same bottom pad C1, C2, or C3. For example, LEDs disposed in a first row and emitting red light are commonly electrically connected to the pad R1, and LEDs emitting red light disposed in a second row are commonly electrically connected to the pad R2. In addition, LEDs disposed in the first row and emitting green light are commonly electrically connected to the bottom pad G1, and LEDs disposed in the second row and emitting green light are commonly electrically connected to the bottom pad G2. LEDs disposed in the first row and emitting blue light are commonly electrically connected to the bottom pad B1, and LEDs disposed in the second row and emitting blue light are commonly electrically connected to the bottom pad B2. Meanwhile, all of LEDs arranged in a first column are commonly electrically connected to the bottom pad C1, all of LEDs arranged in a second column are commonly electrically connected to the bottom pad C2, and all of LEDs arranged in a third column are commonly electrically connected to the bottom pad C3.

FIGS. 9A through 9D are schematic cross-sectional views illustrating a method of manufacturing a display apparatus using a pixel module according to an exemplary embodiment.

Figure 9A:
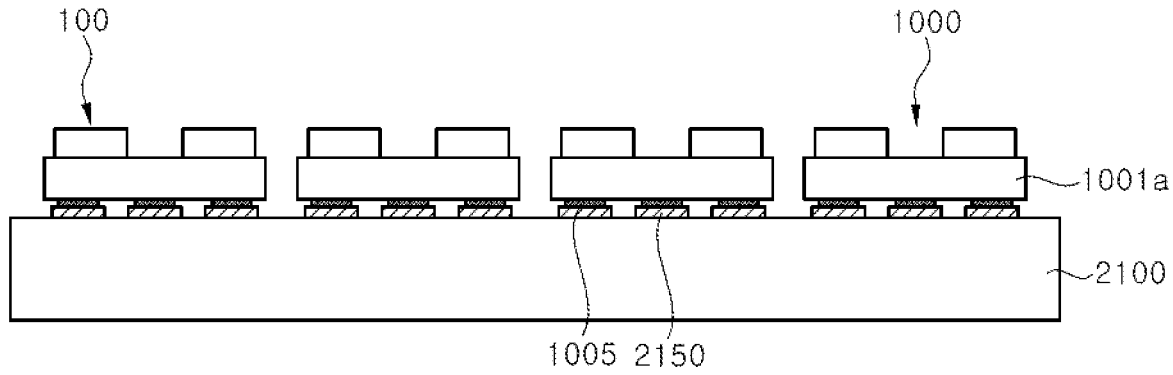
FIGS. 9A through 9D are schematic cross-sectional views illustrating a method of manufacturing a display apparatus using a pixel module according to an exemplary embodiment.

First, referring to FIG. 9A, a pixel module 1000 is arranged on a panel substrate 2100. The panel substrate 2100 may include a high density interconnect (HDI) PCB. The pixel module 1000 includes a linking substrate 1001a and a plurality of unit pixels 100. The pixel module 1000 may be formed by mounting the unit pixels 100 on a large-area linking substrate 1001, and then cutting them into a desired size.

The pixel module 1000 may be mounted by bonding bottom pads 1005 of the linking substrate 1001a to pads 2150 of the panel substrate 2100. The bottom pads 1005 may be mounted on the panel substrate 2100 using, for example, an ACF (1007 in FIG. 7B). The pixel modules 1000 may be spaced apart from one another on the panel substrate 2100.

Figure 9B:
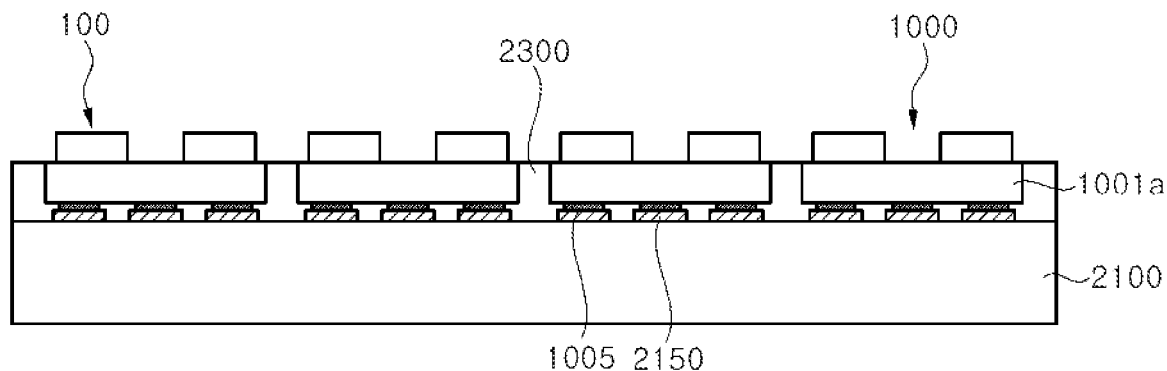

Referring to FIG. 9B, a first molding member 2300 filling a region between the linking substrates 1001a is formed. The first molding member 2300 may include acryl-based, silicone-based, or urethane-based resin, epoxy, or an epoxy molding compound (EMC), and may be black or transparent. The first molding member 2300 covers a side surface of the linking substrate 1001a.

Figure 9C:
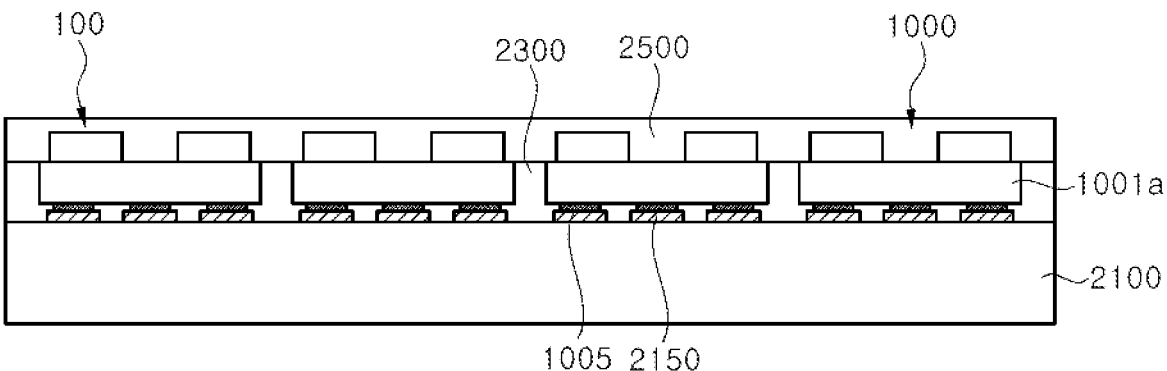

Referring to FIG. 9C, a second molding member 2500 covering the unit pixels 100 is formed. The second molding member 2500 may include acryl-based, silicone-based, or urethane-based resin, epoxy, or an epoxy molding compound (EMC), and may be black or transparent.

The second molding member 2500 may have a flat upper surface, without being limited thereto. For example, the second molding member 2500 may have a concave shape in a region between the unit pixels 100. In this embodiment, the second molding member 2500 is illustrated and described as covering upper surfaces of the unit pixels 100, but the present disclosure is not limited thereto. That is, the second molding member 2500 may be formed so as to expose the upper surfaces of the unit pixels 100.

Figure 9D:
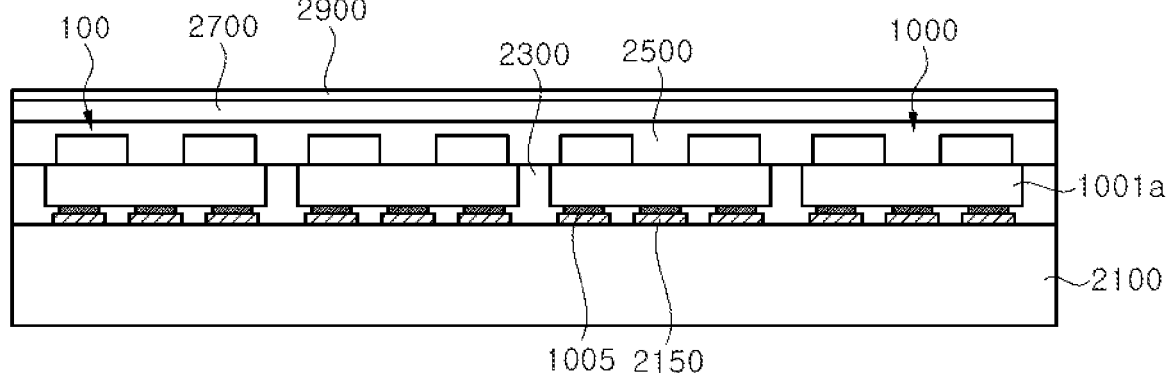

Referring to FIG. 9D, an adhesive layer 2700 is formed on the second molding member 2500, and an anti-glare layer 2900 is formed thereon. The adhesive layer 2700 may be formed using a transparent adhesive. The adhesive layer 2700 may be omitted. The anti-glare layer 2900 may be a coating layer or may be a film.

For example, the anti-glare layer 2900 may be coated using a spray coating technique. Additionally, the anti-glare layer 2900 may be cured using ultraviolet rays.

The anti-glare layer 2900 may prevent glare by scattering light by including, for example, fine particles of silica, melamine, acryl, or the like, and may improve clarity and smoothness of a surface while maintaining high transmittance.

The anti-glare layer 2900 may include, for example, fine particles such as silica, melamine, and acrylic together with polymers such as acryl, silicone, and urethane. Anti-glare effect may be adjusted by adjusting densities and sizes of the particles, a thickness of the anti-glare layer 2900, and the like.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A display apparatus, comprising:
a panel substrate; and
a plurality of pixel modules disposed on the panel substrate,
each pixel module of the plurality of pixel modules including: a linking substrate including at least one interconnection region and a non-interconnection region adjacent to the interconnection region; and
a plurality of unit pixels disposed on each of the interconnection regions of the linking substrate,
wherein a shortest distance W3 between a center of a unit pixel of the plurality of unit pixels and an edge of the pixel module is less than ½ of an average distance W1 between centers of unit pixels adjacent to one another on a same interconnection region.

2. The display apparatus of claim 1,
wherein the linking substrate includes top pads for mounting the unit pixels and bottom pads for being mounted on the panel substrate, and the number of the bottom pads is smaller than the number of the top pads.

3. The display apparatus of claim 2,
wherein the top pads have a multi-layered structure.

4. The display apparatus of claim 2,
wherein at least one of the bottom pads is a dummy pad.

5. The display apparatus of claim 1, wherein:
the linking substrate includes a plurality of interconnection regions, and
a center-to-center distance W2 of unit pixels disposed on adjacent interconnection regions, respectively, and adjacent to one another is within a range of ±10% of the average distance W1 between the centers of unit pixels adjacent to one another on the same interconnection region.

6. The display apparatus of claim 1, wherein the linking substrate includes a plurality of interconnection regions, and the plurality of interconnection regions has a same interconnection pattern.

7. The display apparatus of claim 1, further comprising:

a first molding member covering a region between the linking substrates; and a second molding member covering a region between the unit pixels.

8. The display apparatus of claim 7, further comprising:

an adhesive layer disposed on the second molding member; and an anti-glare layer disposed on the adhesive layer.

9. The display apparatus of claim 8, wherein the first and second molding members are black and the adhesive layer is transparent.

10. A pixel module for a display apparatus, comprising:

a linking substrate including at least one interconnection region and a non-interconnection region adjacent to the interconnection region, and a plurality of unit pixels disposed on each of the interconnection regions of the linking substrate, wherein the linking substrate includes top pads for mounting the unit pixels and bottom pads for being mounted on the panel substrate, and the number of the bottom pads is smaller than the number of the top pads;

wherein each unit pixel of the plurality of unit pixels includes three LEDs, wherein LED groups emitting light of a same color in unit pixels disposed in a same row are electrically connected to same bottom pads, respectively, and wherein LEDs disposed in a same column are electrically connected to a single same bottom pad.

11. The pixel module of claim 10, wherein at least one of the bottom pads is a dummy pad.

12. The pixel module of claim 10, wherein the linking substrate includes a plurality of interconnection regions, and the plurality of interconnection regions has a same interconnection pattern.

13. The pixel module of claim 12, wherein a center-to-center distance W2 of unit pixels disposed on adjacent interconnection regions, respectively, and adjacent to one another is within a range of ±10% of an average distance W1 between centers of unit pixels adjacent to one another on a same interconnection region.

14. The pixel module of claim 10, wherein a shortest distance W3 between the center of the unit pixel and an edge of the pixel module is less than ½ of the average distance W1 between the centers of unit pixels adjacent to one another on the same interconnection region.

15. The pixel module of claim 10, wherein:

the linking substrate includes a plurality of interconnection regions and non-interconnection regions adjacent to each of the interconnection regions, and each of the interconnection regions includes a plurality of top pads disposed on an upper surface thereof and a plurality of bottom pads disposed on a lower surface thereof.

16. The pixel module of claim 15, wherein in each of the interconnection regions, the number of bottom pads is smaller than the number of top pads.

17. The pixel module of claim 15, wherein the top pads have a multilayer structure.

\* \* \* \* \*